United States Patent
Fukui

(10) Patent No.: US 6,207,298 B1
(45) Date of Patent: Mar. 27, 2001

(54) CONNECTOR SURFACE-TREATED WITH A SN-NI ALLOY

(75) Inventor: Kunihiko Fukui, Osaka (JP)

(73) Assignee: Japan Solderless Terminal Mfg. Co., Ltd., Osaka (JP)

(*) Notice: Subject to any disclaimer, the term of this patent is extended or adjusted under 35 U.S.C. 154(b) by 0 days.

(21) Appl. No.: 09/212,280

(22) Filed: Dec. 16, 1998

(30) Foreign Application Priority Data

Dec. 25, 1997 (JP) .................................... 9-358638

(51) Int. Cl.⁷ .................... H01L 23/50; H01R 9/00; H01R 11/00
(52) U.S. Cl. .................... 428/646; 428/620; 428/628; 428/680; 439/887; 257/677
(58) Field of Search .................... 428/640, 680, 428/628, 620; 439/886, 887; 257/677, 787, 790

(56) References Cited

U.S. PATENT DOCUMENTS

| | | | |
|---|---|---|---|
| 4,014,660 | * | 3/1977 | Schreiner et al. . |
| 4,707,724 | * | 11/1987 | Suzuki et al. . |
| 4,837,073 | * | 6/1989 | McAllister . |
| 5,585,195 | * | 12/1996 | Shimada . |
| 5,597,656 | * | 1/1997 | Carey, II et al. . |

FOREIGN PATENT DOCUMENTS

| | | | |
|---|---|---|---|
| 34 06 542 | * | 4/1985 | (DE) . |
| 54-081777 | * | 6/1979 | (JP) . |
| 54-129976 | * | 10/1979 | (JP) . |
| 62-291951 | * | 12/1987 | (JP) . |
| 3-237750 | * | 10/1991 | (JP) . |
| 5-098464 | * | 4/1993 | (JP) . |
| 7-169899 | * | 7/1995 | (JP) . |
| 2543619 | | 7/1996 | (JP) . |
| 9-237862 | * | 9/1997 | (JP) . |

\* cited by examiner

Primary Examiner—Deborah Jones
Assistant Examiner—Jason Savage
(74) Attorney, Agent, or Firm—Rader, Fishman & Grauer

(57) ABSTRACT

A tin-nickel alloy containing not less than 75 wt % and less than 100 wt % of tin with the balance of nickel. The alloy is used, for example, for formation of a surface treatment layer of an electronic component which is to be soldered onto a substrate with the use of the surface mount technology. The surface treatment layer preferably has a thickness of not less than 0.1 μm and less than 0.5 μm. The electronic component preferably further includes a nickel deposit layer as an underlying layer interposed between a base of the component and the surface treatment layer.

7 Claims, 5 Drawing Sheets

CONNECTOR SURFACE-TREATED WITH A SN-NI ALLOY

BACKGROUND OF THE INVENTION

1. Field of the Invention

The present invention relates to a tin-nickel alloy and a component surface-treated with such an alloy and, more particularly, to an electronic component to be soldered on a substrate surface with the use of the surface mount technology.

2. Description of Related Art

Typical methods for mounting an electronic component such as a connector on a surface of a substrate include a dip soldering method and a surface mount technology (SMT).

In the dip soldering method, leads and the like of an electronic component are preliminarily inserted into holes formed in a substrate, and the substrate is then dipped in a solder melt in a solder bath. Thus, the solder adheres only onto desired portions to achieve electrical and mechanical connection between the electronic component and the substrate.

In the surface mount technology, a solder paste is preliminarily applied onto electronic component connection areas on a surface of a substrate, and then an electronic component is mounted on the substrate with its joint portions being in contact with the solder paste. Subsequently, the substrate and the electronic component mounted thereon are put in a hot air reflow oven, and maintained in an atmosphere at a peak temperature of about 250° C. for a predetermined period (e.g., 60 seconds to 120 seconds), whereby the solder paste is fused. In turn, the substrate is taken out of the hot air reflow oven and cooled for solidification of the solder paste. Thus, the electrical and mechanical connection between the substrate and the electronic component is achieved.

An electronic component such as a connector which includes a copper alloy base or an iron base, for example, is in some cases subjected to a surface treatment such as plating for improvement of the appearance thereof. In this case, a surface treatment layer (e.g., deposit layer) should have a certain level of solder wettability (particularly, solder wettability after the lapse of a predetermined time from the surface treatment) for easy mounting of the electronic component on a substrate.

Particularly where the surface mount technology is employed, the surface treatment layer should also have a heat resistance sufficient to withstand a treatment at a high temperature.

If the surface treatment layer has an insufficient heat resistance, the layer is melted so that it cannot maintain its good appearance. That is, the surface treatment layer becomes less lustrous, and is roughened or flaked off upon solidification thereof after the melting thereof. The roughening and flaking of the surface treatment layer impair the solderability of the electronic component.

Where an electronic component is mounted on the substrate with the use of the surface mount technology, a palladium deposit layer, which has a higher melting point (1550° C.) and a superior solderability, is conventionally employed as a surface treatment layer.

However, palladium is a very expensive metal, and it is therefore not economical to employ palladium for the formation of a surface treatment layer. Besides palladium, gold and silver are known to have high melting points (1064.4° C. and 961.9° C., respectively) and a satisfactory solderability, but are very expensive. Therefore, gold and silver also have the same drawback as palladium when they are employed for the formation of a surface treatment layer.

SUMMARY OF THE INVENTION

It is an object of the present invention to provide a tin-nickel alloy which has a sufficient heat resistance and a satisfactory solderability and is effective for cost reduction of a component.

It is another object of the present invention to provide a component which has been surface-treated so as to be imparted with a sufficient heat resistance and a satisfactory solderability.

To achieve the aforesaid objects, the tin-nickel alloy according to the present invention comprises not less than 75 wt % and less than 100 wt % of tin with the balance of nickel.

With this arrangement, the tin-nickel alloy has a satisfactory solderability and a sufficient heat resistance. In addition, a drastic cost reduction can be achieved in comparison with the use of palladium.

If the tin content in the tin-nickel alloy is less than 75 wt %, the solderability is impaired. Conversely, if the tin content is 100 wt %, the heat resistance is insufficient because the melting temperature of pure tin is relatively low (about 232° C.). In addition, the use of 100-wt % tin for the surface treatment layer of the component results in formation of whiskers. Therefore, particularly where the component is used in electric circuitry, a failure associated with a short circuit may occur.

The tin-nickel alloy preferably comprises 75 wt % to 95 wt % of tin with the balance of nickel. In such a case, the tin-nickel alloy has a melting temperature of not lower than about 250° C. and hence a sufficient heat resistance.

The tin-nickel alloy more preferably comprises 75 wt % to 88 wt % of tin with the balance of nickel. In such a case, the alloy has an improved solderability.

The component according to the present invention has a surface treatment layer formed of the aforesaid alloy on a base thereof.

With this arrangement, the surface treatment layer formed on the base of the component has a satisfactory solderability and a sufficient heat resistance, and the mounting of the component on a substrate surface is therefore facilitated.

Electronic components and other components are included as the component. Examples of specific electronic components include connectors, semiconductor IC packages, semiconductor IC chips, and conductive members (contacts and lead frames for semiconductor ICs) for electrical connection. The connector may have, for example, a main body of a resin, and metal components attached to the main body. The metal components include, for example, a metal shell covering the main body, and contacts fixed on the main body.

The surface treatment layer preferably has a thickness of not less than 0.1 μm and less than 0.5 μm.

It is preferred that an underlying layer is interposed between the surface treatment layer and the base of the component.

The underlying layer may be a deposit layer, preferably a nickel deposit layer which is lustrous.

Where the deposit layer formed on the surface of the component has a thickness of about 0.1 μm, for example, pin holes are formed in the deposit layer due to evolution of hydrogen gas during the plating process. This results in a deteriorated solder wettability. Therefore, the thickness of the surface treatment layer is preferably not less than 0.1 μm.

The aforesaid surface treatment layer tends to discolor in a high temperature atmosphere. The discoloration does not affect the performance of the surface treatment layer but, if remarkable, impairs the appearance of the layer. The discoloration is supposedly caused by such a mechanism that metal tin and metal nickel precipitated in the tin-nickel alloy deposit layer form a solid solution at a high temperature and then recrystallized.

It has experimentally been found that, if the thickness of the surface treatment layer is not less than 0.5 μm, the discoloration is noticeable (the discoloration is noticed only by comparing the appearances before and after the surface treatment layer is placed in the high temperature atmosphere), and, if the thickness is not less than 1.0 μm, the discoloration is distinct. Accordingly, the thickness of the surface treatment layer is preferably not less than 0.1 μm and less than 0.5 μm.

Therefore, the surface treatment layer having a thickness of not less than 0.1 μm and less than 0.5 μm does not suffer from the apparent discoloration even after the component is kept in the high temperature atmosphere, for example, for soldering the electronic component onto the substrate. Hence, the component has a good appearance and a surface state with a satisfactory solderability.

The underlying layer interposed between the surface treatment layer and the base of the component provides for light reflection, thereby imparting a good appearance to the component.

The component may be an electronic component which is to be subjected to a soldering process at a high temperature of not lower than 230° C.

With this arrangement, the electronic component has a good appearance even after having been subjected to the soldering process at the high temperature. In addition, the surface of the electronic component has a satisfactory solderability. Even if the mounting of the electronic component is achieved not by employing the surface mount technology but by soldering at a high temperature of not lower than 230° C., the component of the present invention has a good appearance and a satisfactory solderability.

The component may be an electronic component which is to be soldered onto a substrate with the use of the surface mount technology.

Where the electronic component is to be soldered onto the substrate with the use of the surface mount technology, the entire electronic component is placed in a high temperature atmosphere. Even after the soldering process, the electronic component of the present invention has a good appearance and a surface state with a satisfactory solderability.

The foregoing and other objects, features and effects of the present invention will become more apparent from the following description of the preferred embodiments with reference to the attached drawings.

DESCRIPTION OF THE PREFERRED EMBODIMENTS

A connector according to one embodiment of the present invention will hereinafter be described in detail with reference to the attached drawings. It should be noted, however, that the application of the invention is not limited to the connector. More specifically, the invention can widely be applied to any electronic components which are to be soldered onto a substrate with the use of the surface mount technology. Additionally to electronic components, the invention can be applied to any components which are to be soldered and to be later exposed to a high temperature. In any cases, the invention provides superior effects.

Figure 1:
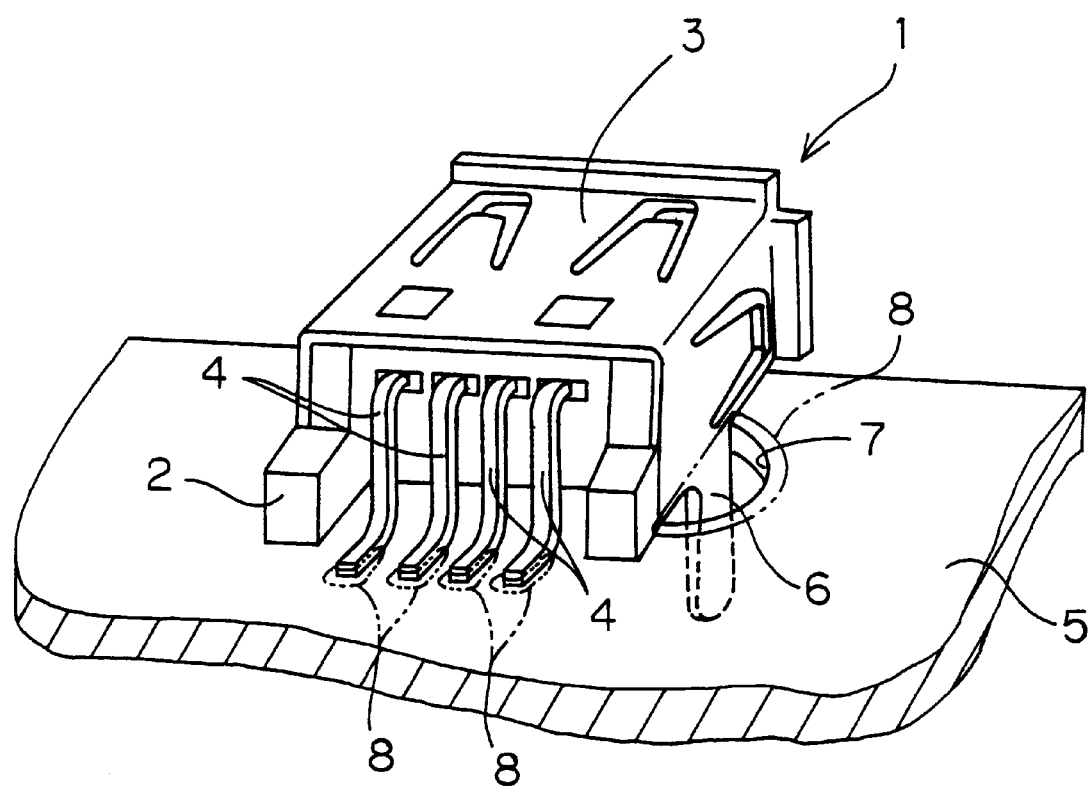
FIG. 1 is a perspective view illustrating a connector mounted on a substrate.

FIG. 1 is a perspective view illustrating the connector 1 mounted on a substrate 5 in accordance with the embodiment of the present invention. Referring to FIG. 1, the connector 1 includes a resin housing 2, a metal shell 3 covering the exterior of the housing 2, and a plurality of contacts 4 led out of the housing 2.

The housing 2 has a generally rectangular parallelepiped shape. The metal shall 3 is formed by folding an elongate iron plate into an inverted U-shape in section to cover the top and side faces of the housing 2.

Joint portions 6, 6 (only one of them is shown in FIG. 1) respectively project from opposite lower edges of the metal shell 3, and are inserted in through-holes 7, 7 (only one of them is shown in FIG. 1) formed in the substrate 5. Thus, the metal shell 3 and the housing 2 are properly positioned with respect to the substrate 5. The joint portions 6, 6 are soldered to areas adjacent to the through-holes 7, 7 on the substrate 5, so that the connector 1 is fixed to the substrate 5.

The plurality of contacts 4 are metal (brass) bars which are arranged in line. One end of each of the contacts 4 is led into the housing 2 to serve as a terminal, while the other end is connected to the substrate 5.

The joint portions 6, 6 and the contacts 4 are soldered to be fixed onto the substrate 5. The surface mount technology is employed for the soldering. For the soldering on the basis of the surface mount technology, a solder paste 8 is preliminarily applied onto the areas adjacent to the through-holes 7, 7 and onto contact connection areas, where the contacts 4 are to be connected, on the substrate 5. After the application of the solder paste 8, the joint portions 6, 6 are inserted into the through-holes 7, 7, and, in this state, the connector 1 and the substrate 5 are put in a hot air reflow oven and kept in an atmosphere at a peak temperature of about 250° C. for a predetermined time period. The solder paste 8 is thus fused, and then solidified upon cooling. Thus, the mounting of the connector 1 onto the substrate 5 is achieved.

Figure 2:
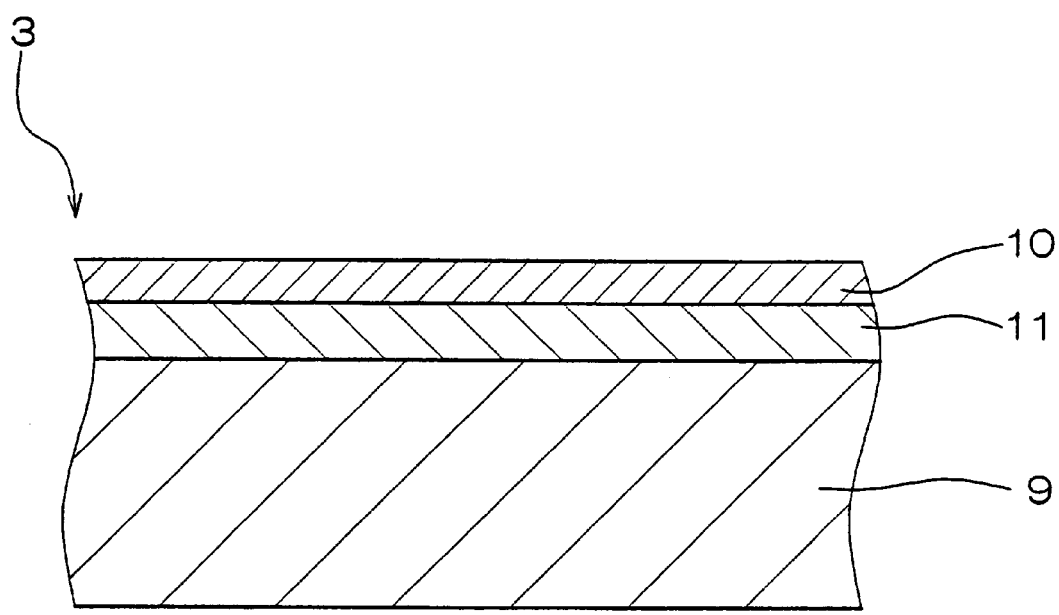
FIG. 2 is a schematic sectional view illustrating a metal shell.

FIG. 2 is a schematic sectional view illustrating part of the metal shell 3. The metal shell 3 includes a nickel deposit layer 11 formed as the underlying layer on the surface of an iron base 9, and a tin-nickel alloy deposit layer 10 formed as the surface treatment layer on the surface of the nickel deposit layer 11.

Like the metal shell 3, the contacts 4 also each include a nick deposit layer 11 formed as the underlying layer, and a tin-nickel alloy deposit layer 10 formed as the surface treatment layer on the surface of the nickel deposit layer 11.

The tin-nickel alloy deposit layer 10 is preferably composed of a tin-nickel alloy containing not less than 75 wt % and less than 100 wt % of tin, more preferably not less than 75 wt % and less than 95 wt % of tin, still more preferably not less than 75 wt % and less than 88 wt % of tin, with the balance of nickel.

The tin-nickel alloy deposit layer 10 as the surface treatment layer having the aforesaid formulation exhibits a satisfactory solderability and a sufficient heat resistance. Therefore, the connector 1 can properly be mounted on the substrate 5. In addition, a drastic cost reduction can be achieved in comparison with the conventional case where palladium or the like is employed for a surface treatment layer.

The tin-nickel alloy deposit layer 10 preferably has a thickness of not less than 0.1 $\mu$m and less than 0.5 $\mu$m, more preferably not less than 0.1 $\mu$m and less than 0.35 $\mu$m, still more preferably not less than 0.1 $\mu$m and less than 0.3 $\mu$m. The tin-nickel alloy deposit layer having a thickness in the aforesaid range keeps the surface of the component lustrous, even after the component is maintained in an atmosphere at a peak temperature of about 250° C. in a hot air reflow oven for the soldering with the use of the surface mount technology.

A copper deposit layer may be employed as the underlying layer instead of the nickel deposit layer.

While the embodiment of the present invention has thus been described, the invention is not limited to this particular embodiment.

For example, a tin-nickel alloy deposit layer as described above may be formed on pads of bonding wires for connection of a lead frame with a semiconductor IC chip. In such a case, the tin-nickel alloy deposit layers on the bonding pads have a heat resistance sufficient to withstand a temperature rise up to about 200° C. which may result from heat generated by circuitry (e.g., CPU) within the IC chip. The deposit layer will never be fused due to the temperature rise, so that a connection failure at the bonding pads connecting the lead frame with the chip can assuredly be prevented. Further, a drastic cost reduction can be achieved in comparison with the conventional case where a gold deposit layer is employed as the surface treatment layer.

In this case, the lead frame may be plated with the aforesaid tin-nickel alloy. Thus, the lead frame has a satisfactory solderability and a good appearance.

The application of the invention is not limited to the aforesaid components, but the invention can advantageously be applied to any other components which are required to have a heat resistance up to about 250° C. and a certain level of solder wettability.

Embodiment 1

Samples 1 to 5 were each prepared by forming a 5-$\mu$m thick nickel deposit layer as the underlying layer on a base composed of a brass material and forming a 2-$\mu$m thick tin-nickel alloy deposit layer as the surface treatment layer on the nickel deposit layer. Then, the solder wettability of each of the samples was determined.

Determination of Solder Wettability

For determination of the solder wettability, a zero-cross time was measured by way of Menicsography in conformity with the test method RCX-0102/0101 specified by EIAJ (Standards of Electronic Industries Association of Japan).

Figure 3:
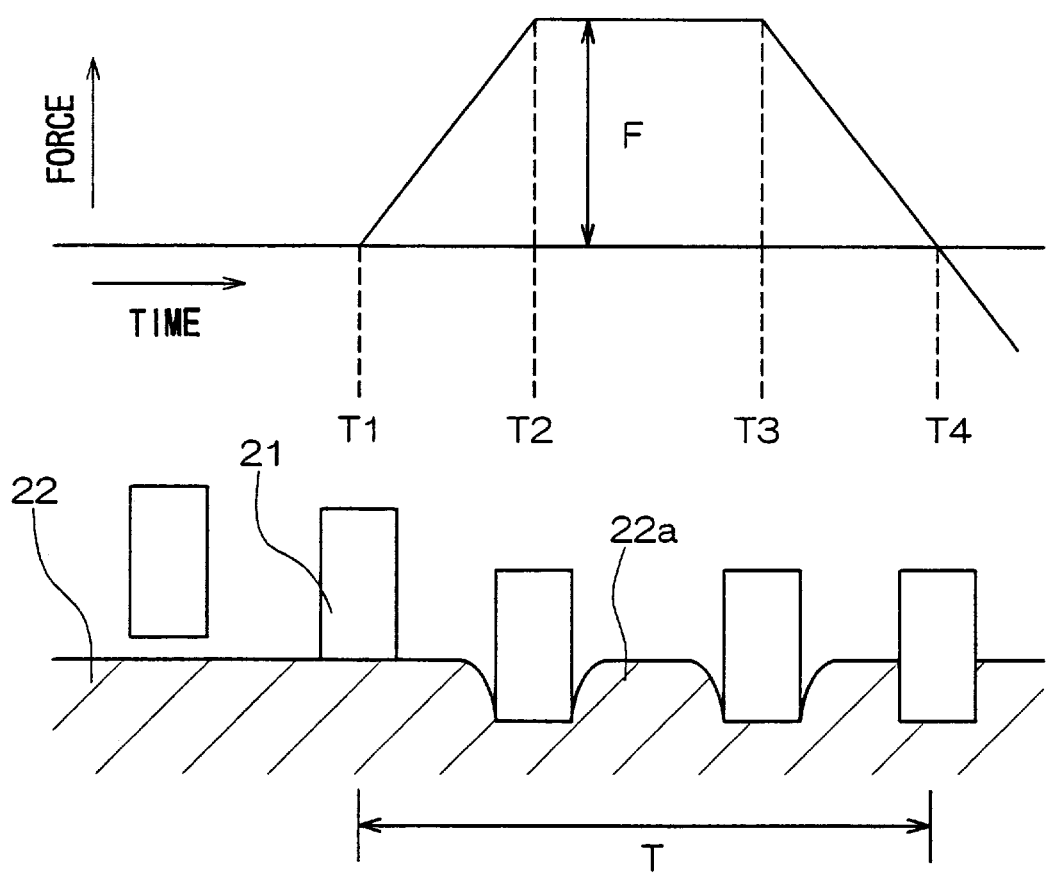
FIG. 3 is a Menisco graph for explaining the principle of measurement of a solder wettability (zero-cross time)

FIG. 3 is a Menisco graph for explaining the principle of the measurement of the zero-cross time. The graph shown on the upper side of FIG. 3 illustrates a time-related change in a force applied to a specimen by a solder melt when the specimen is slowly dipped in a solder melt bath. The diagram shown on the lower side of FIG. 3 illustrates positional relationships between the specimen 21 and the solder melt 22 and a change in the state of a surface 22a of the solder melt 22.

For the measurement of the zero-cross time, the specimen 21 is slowly dipped in the solder melt bath. At this time, the upward force acting on the specimen 21 is measured by a steelyard balance (not shown).

When the bottom surface of the specimen 21 is brought into contact with the surface 22a of the solder melt 22 at a time point T1, the solder melt 22 repels the specimen 21, and the surface tension of the solder melt 22 acts upward on the specimen 21. Thus, the upward force is applied to the specimen 21. The upward force increases as the specimen 21 sinks into the solder melt 22. When the specimen 21 stops sinking at a time point T2, the upward force applied to the specimen 21 becomes constant. As the bottom surface of the specimen 21 is wetted with the solder after a time point T3, the upward force acting on the specimen 21 decreases. After a time point T4 called zero point, the upward force becomes negative. That is, a force is applied to the specimen 21 in such a direction that the specimen is drawn into the solder melt 22.

The zero-cross time T is a time required before a solder-wetted area becomes 100%, i.e., a time period from the time point T1 when the bottom surface of the specimen 21 is brought into contact with the surface 22a of the solder melt 22 to the time point T4 when the force applied to the specimen 21 by the solder melt 22 becomes zero. The zero-cross time T is herein employed to represent the solder wettability.

Accelerated Aging

The solder wettability of the metal deposit layer is generally very good immediately after the plating thereof, but gradually deteriorated with time. For determination of a time-related change in the solder wettability, an accelerated aging test was performed in conformity with the test method RCX-0102/0101 specified by EIAJ (Standards of Electronic Industries Association of Japan) to simulate the aging of the specimen after the lapse of a predetermined period.

In this embodiment, the zero-cross times for the samples 1 to 5 respectively formed with different tin-nickel alloy deposit layers were measured immediately after the tin-nickel deposit layers were formed by plating and after the samples were treated with steam for 4 hours (for the accelerated aging).

It is noted that the tin-nickel alloy deposit layers of the samples 1 to 5 were composed of tin-nickel alloys having tin contents of 74 wt %, 77 wt %, 80 wt %, 84 wt % and 88 wt %, respectively.

Figure 4:
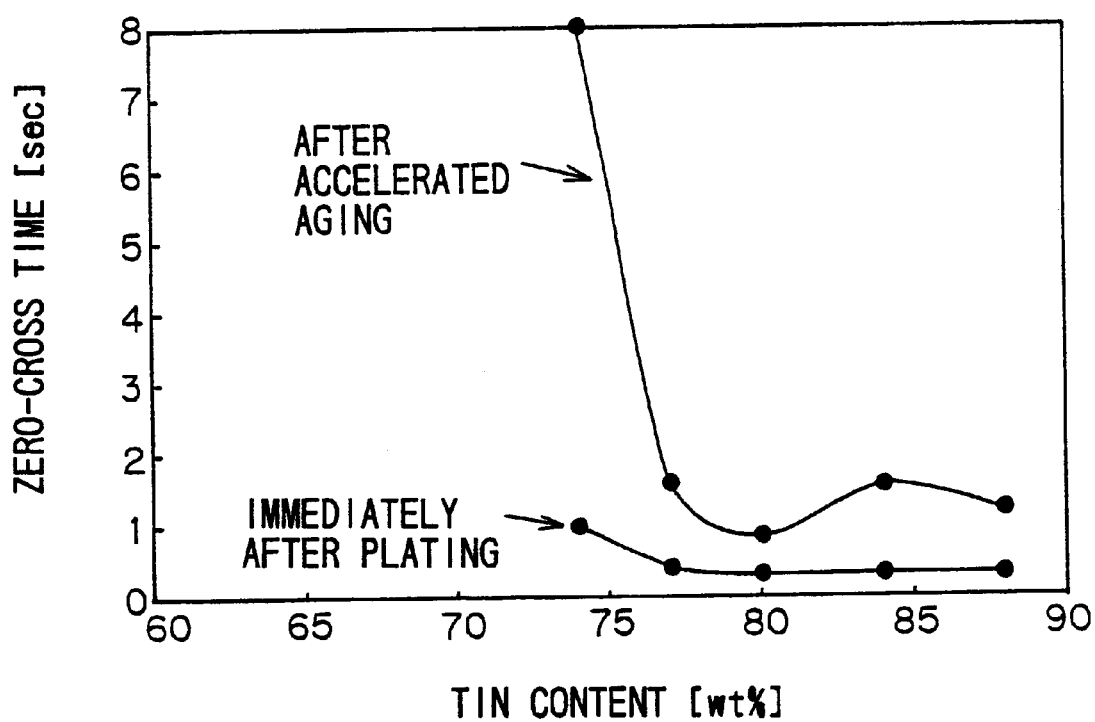
FIG. 4 is a graph illustrating a relationship between the tin content in a tin-nickel alloy and the solder wettability (zero-cross time)

The results are shown in FIG. 4, which is a graph illustrating a relationship between the tin content in the tin-nickel alloy and the zero-cross time.

As can be seen from FIG. 4, the sample 1 had a notably poor solder wettability, while the samples 2 to 5 each had a satisfactory solder wettability even after the accelerated aging.

Next, the samples 1 to 5 were kept in a high temperature atmosphere at 250° C. for 30 minutes, and then checked for discoloration thereof.

No discoloration was observed on the sample 1, while the sample 2 experienced slight discoloration. The degree of the discoloration increased as the tin content increased (the sample 5 had the greatest discoloration degree).

In this test, the discoloration occurred due to the great thickness (2 $\mu$m) of the tin-nickel alloy deposit layer.

Embodiment 2

Samples 6 to 11 were each prepared such as to have a tin-nickel alloy deposit layer having a tin content of 80 wt % as the surface treatment layer and a 0.5-μm thick nickel deposit layer as the underlying layer interposed between the base and the surface treatment layer. The tin-nickel alloy deposit layers of the samples 6 to 11 had thicknesses of 0.05 μm, 0.1 μm, 0.3 μm, 0.5 μm, 1.0 μm and 2.0 μm, respectively. The solder wettability of each of the samples 6 to 11 was determined immediately after the formation of the tin-nickel alloy deposit layer by plating and after the accelerated aging.

Figure 5:
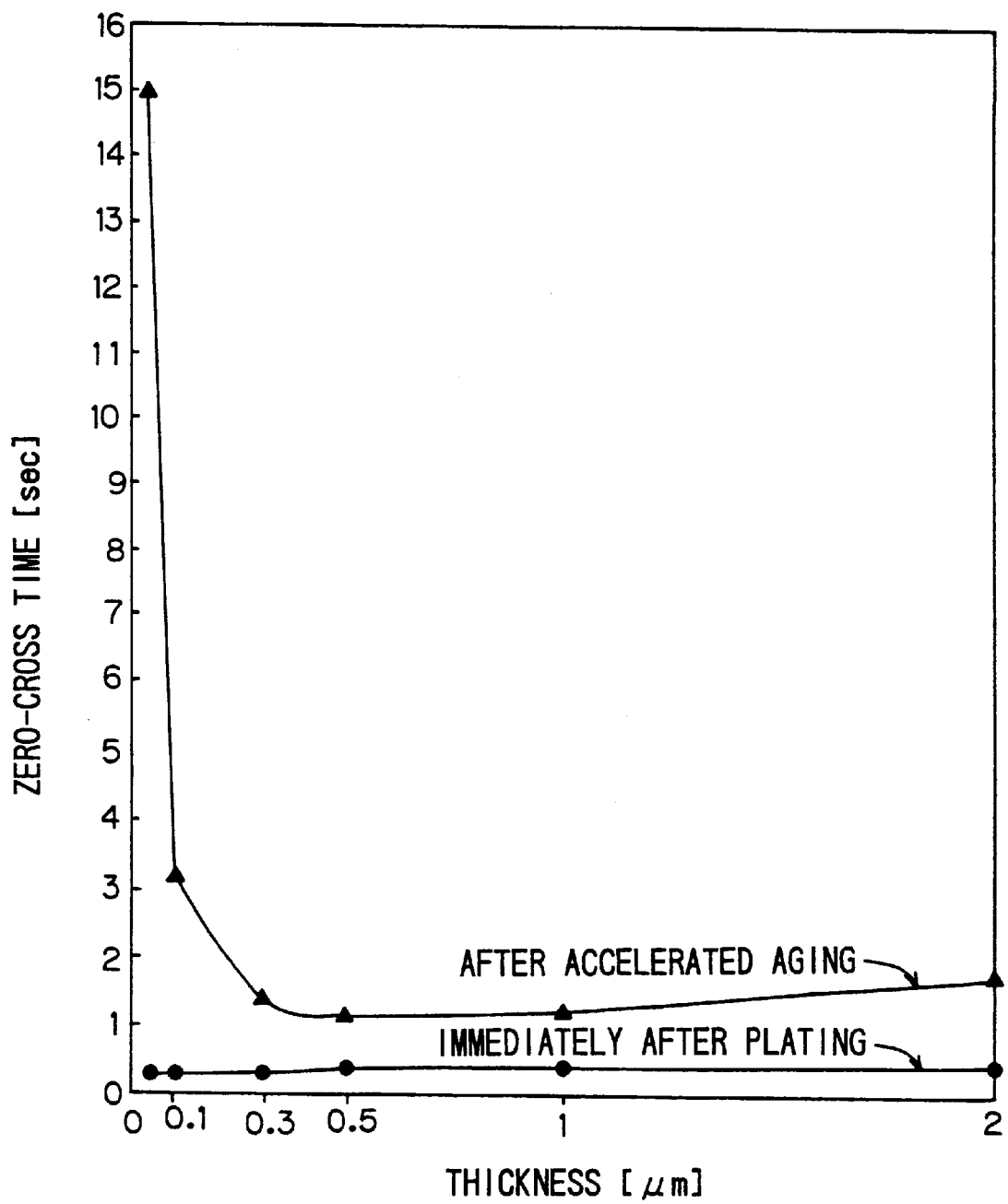
FIG. 5 is a graph illustrating a relationship between the solder wettability (zero-cross time) and the thickness of a deposit layer composed of a tin-nickel alloy having a tin content of 80 wt %.

The results are shown in FIG. 5, which is a graph illustrating a relationship between the zero-cross time and the thickness of the tin-nickel alloy deposit layer.

The sample 6 exhibited a notably poor solder wettability after the accelerated aging. Therefore, the 0.05-μm thick tin-nickel alloy deposit layer is not suitable for practical applications. On the other hand, the tin-nickel alloy deposit layers having thicknesses of not less than 0.1 μm had a satisfactory solder wettability.

Next, the samples 6 to 11 were kept in a high temperature atmosphere at 250° C. for 30 minutes, and then checked for discoloration thereof.

No discoloration was observed on the samples 6 to 8. The sample 9 experienced slight discoloration (which was noticed only by comparing the appearances before and after the sample was kept in the high temperature atmosphere). The discoloration of the samples 10 and 11 which were each formed with a tin-nickel alloy deposit layer having a greater thickness was distinct.

While the present invention has been described in detail by way of the embodiments thereof, it should be understood that the foregoing disclosure is merely illustrative of the technical principles of the present invention but not limitative of the same. The spirit and scope of the present invention are to be limited only by the appended claims.

This application claims the conventional priority on the basis of Japanese Patent Application No. 9-358638 filed to the Japanese Patent Office on Dec. 25, 1997, the disclosure thereof being incorporated herein by reference.

What is claimed is:

1. A connector for an electrical component, comprising:
   a resin material which constitutes a housing of said connector for the electrical component;
   a metal shell, covering at least a part of said resin housing;
   an electrical contact, which comprises a base; and
   a surface treatment layer covering a portion of said metal shell and a portion of the base of said electrical contact, formed of a tin-nickel alloy containing not less than 75 wt % and less than 100 wt % of tin with the balance of nickel.

2. A connector as set forth in claim 1 wherein the surface treatment layer has a thickness of not less than 0.1 μm and less than 0.5 μm.

3. A connector as set forth in claim 1, further comprising an underlying layer interposed between the surface treatment layer and the base.

4. A connector as set forth in claim 3, wherein the underlying layer is a deposit layer formed by plating.

5. A connector as set forth in claim 4, wherein the deposit layer is a nickel deposit layer.

6. A connector as set forth in claim 1, which is part of an electronic component to be subjected to a soldering process in a high temperature atmosphere at not lower than 230° C.

7. A connector as set forth in claim 1, which is part of an electronic component to be soldered onto an substrate with the use of a surface mount technology.

* * * * *